United States Patent
Tsai et al.

(10) Patent No.: US 9,601,584 B2
(45) Date of Patent: Mar. 21, 2017

(54) THIN-FILM TRANSISTOR SUBSTRATE

(71) Applicant: InnoLux Corporation, Miao-Li County (TW)

(72) Inventors: Chia-Hao Tsai, Miao-Li County (TW); Chih-Lung Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/821,158

(22) Filed: Aug. 7, 2015

(65) Prior Publication Data
US 2015/0349067 A1 Dec. 3, 2015

Related U.S. Application Data

(63) Continuation of application No. 14/079,316, filed on Nov. 13, 2013, now Pat. No. 9,123,587.

(30) Foreign Application Priority Data

Nov. 16, 2012 (TW) .............................. 101142761 A

(51) Int. Cl.
*G02F 1/136* (2006.01)
*H01L 29/417* (2006.01)
(Continued)

(52) U.S. Cl.
CPC ........ *H01L 29/4175* (2013.01); *H01L 27/124* (2013.01); *H01L 27/1225* (2013.01);
(Continued)

(58) Field of Classification Search
CPC ........... H01L 29/4175; H01L 29/41733; H01L 27/3258
(Continued)

(56) References Cited

U.S. PATENT DOCUMENTS 5,825,449 A 10/1998 Shin
2010/0207119 A1* 8/2010 Sakata ................ H01L 29/7869
257/43

FOREIGN PATENT DOCUMENTS

CN 1945811 4/2007
CN 1988169 6/2007
(Continued)

OTHER PUBLICATIONS

Chinese language office action dated Dec. 3, 2015, issued in application No. CN 201210464826.4.
(Continued)

*Primary Examiner* — Lucy Chien
(74) *Attorney, Agent, or Firm* — McClure, Qualey & Rodack, LLP

(57) ABSTRACT

An embodiment of the invention provides a thin-film transistor substrate, including: a substrate; a gate electrode disposed on the substrate; a gate insulating layer disposed on the substrate and covering the gate electrode; an active layer disposed on the gate insulating layer and above the gate electrode, wherein the active layer includes a metal oxide; a source electrode disposed on and electrically connecting to the active layer; a first insulating layer covering the source electrode; and a drain electrode disposed on and electrically connecting to the active layer, wherein the drain electrode includes a metal oxide layer.

17 Claims, 5 Drawing Sheets

(51) Int. Cl.
*H01L 27/12* (2006.01)
*H01L 27/32* (2006.01)
*H01L 29/786* (2006.01)
*H01L 29/423* (2006.01)

(52) U.S. Cl.
CPC ...... *H01L 27/3258* (2013.01); *H01L 27/3262* (2013.01); *H01L 29/41733* (2013.01); *H01L 29/42384* (2013.01); *H01L 29/7869* (2013.01)

(58) Field of Classification Search
USPC .......................................................... 349/43
See application file for complete search history.

(56) References Cited

FOREIGN PATENT DOCUMENTS

| CN | 102082179 | 6/2011 |
| CN | 102569187 | 7/2012 |

OTHER PUBLICATIONS

Chinese language office action dated Apr. 28, 2016, issued in application No. CN 201210464826.4.

* cited by examiner

THIN-FILM TRANSISTOR SUBSTRATE

CROSS REFERENCE TO RELATED APPLICATIONS

This application claims the benefit of priority from, and is a continuation application of, U.S. patent application Ser. No. 14/079,316 filed on Nov. 13, 2013, entitled "THIN-FILM TRANSISTOR SUBSTRATE AND DISPLAY", now U.S. Pat. No. 9,123,587, which claims the benefit of priority from Taiwan Application No. 101142761 filed on Nov. 16, 2012 and the entirety of which is incorporated by reference herein.

BACKGROUND OF THE INVENTION

Field of the Invention

The present invention relates to a thin-film transistor, and in particular relates to a thin-film transistor substrate and a display.

Description of the Related Art

As display technology progressively develops, everyday life conveniences for people increase, due to the multitude of displays available. Light and thin features are desirable for displays. Thus, flat panel displays (FPD) are now the most popular type of displays. There are many kinds of FPDs provided, among which liquid-crystal displays (LCD) are popular among consumers because of their advantages such as efficient space utilization, low power consumption, no radiance, and low electromagnetic interference (EMI).

Liquid-crystal displays are mainly formed by a thin-film transistor substrate, a color filter substrate, and a liquid crystal layer therebetween. The thin-film transistor substrate has a plurality of thin-film transistors located in a plurality of pixels respectively.

It is current trend to develop liquid-crystal displays to have a higher resolution. However, the distance between the source electrode and the drain electrode of the thin-film transistor cannot be reduced because the distance is limited by the resolution limit of the present photolithography technique. Thus, if the resolution is improved (that is to say, the size of each pixel is reduced), the aperture ratio of the pixel is reduced significantly. Thus, size reduction of the thin-film transistor has become an important issue.

BRIEF SUMMARY OF THE INVENTION

An embodiment of the invention provides a thin-film transistor substrate, including: a substrate; a gate electrode disposed on the substrate; a gate insulating layer disposed on the substrate and covering the gate electrode; an active layer disposed on the gate insulating layer and above the gate electrode, wherein the active layer includes a metal oxide; a source electrode disposed on and electrically connecting to the active layer; a first insulating layer covering the source electrode; and a drain electrode disposed on and electrically connecting to the active layer, wherein the drain electrode includes a metal oxide layer.

An embodiment of the invention provides a thin-film transistor substrate, including: a substrate; a gate electrode disposed on the substrate; a gate insulating layer disposed on the substrate and covering the gate electrode; an active layer disposed on the gate insulating layer and above the gate electrode, wherein the active layer includes a metal oxide; a source electrode disposed on and electrically connecting to the active layer; a first insulating layer covering the source electrode; and a drain electrode disposed on and electrically connecting to the active layer, wherein a distance between the portion of the source electrode contacting the active layer and the portion of the drain electrode contacting the active layer ranges from 2 μm to 10 μm.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1 is a cross-sectional view of the thin-film transistor substrate along a sectional line I-I' in FIG. 2;

FIG. 3 is a cross-sectional view of the thin-film transistor substrate along a sectional line I-I' in FIG. 4.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

Figure 1:
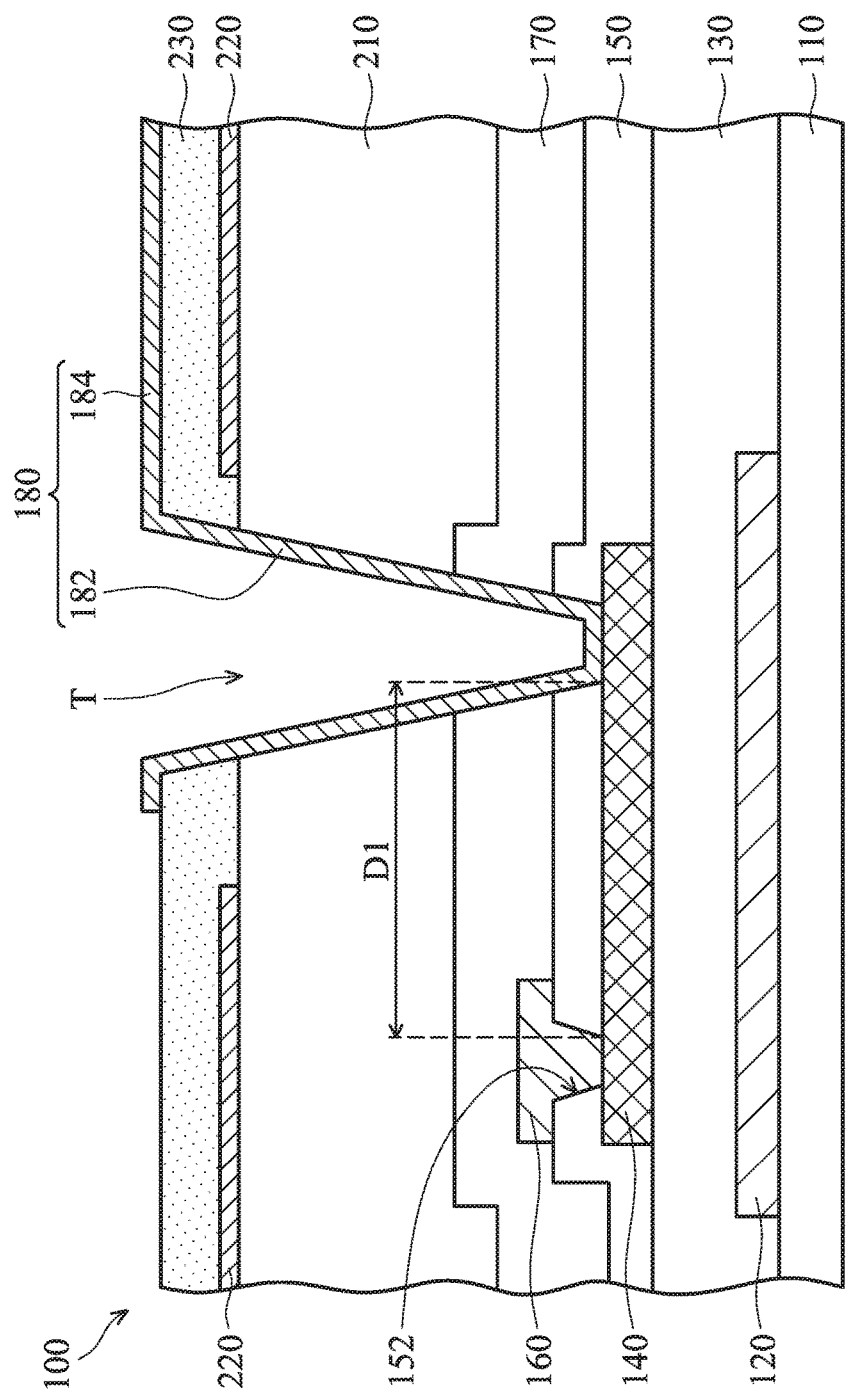
FIG. 1 is a cross-sectional view of a thin-film transistor substrate in accordance with an embodiment of the present invention.
Figure 2:
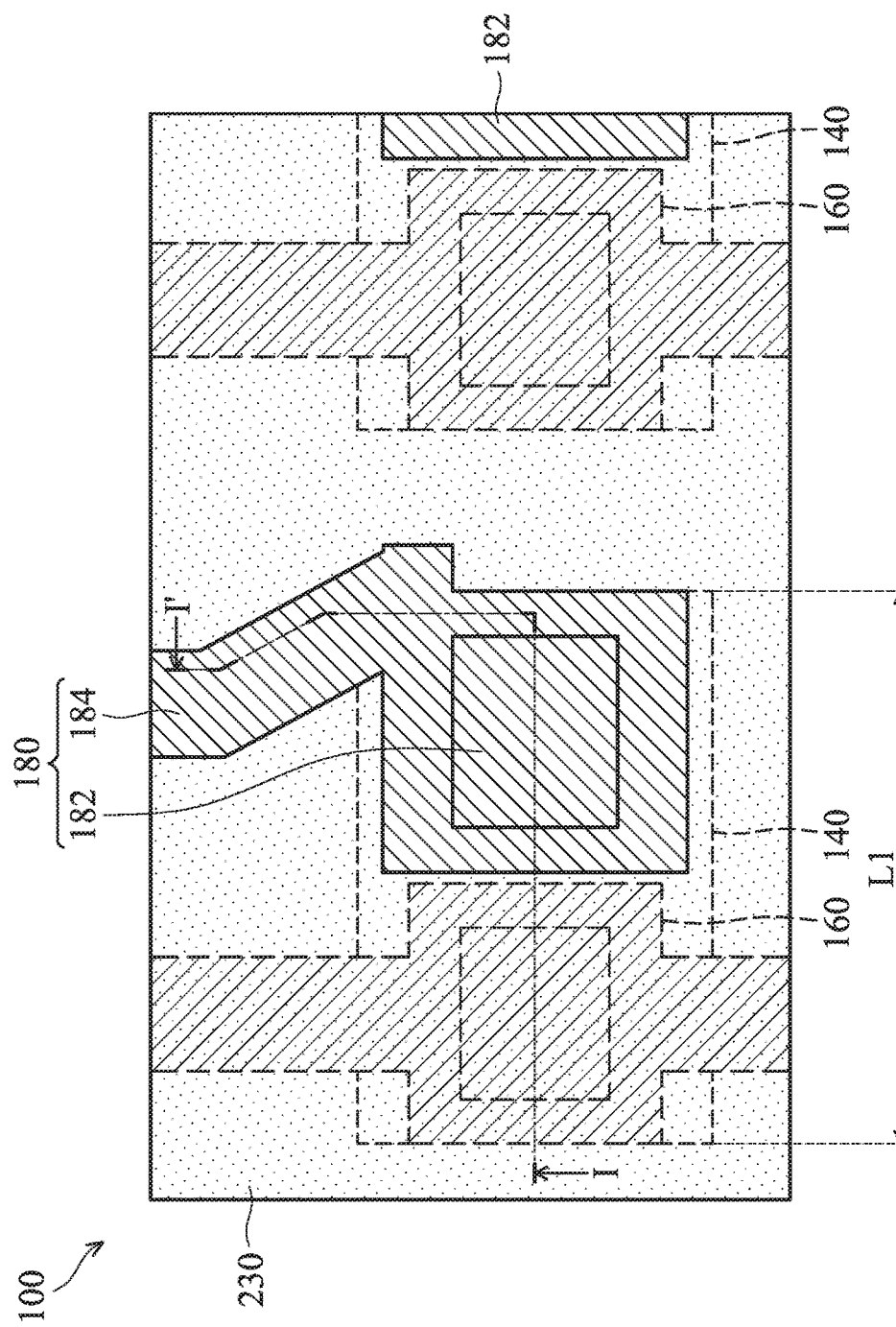
FIG. 2 is a top view of the thin-film transistor substrate in FIG. 1.

FIG. 1 is a cross-sectional view of a thin-film transistor substrate in accordance with an embodiment of the present invention. FIG. 2 is a top view of the thin-film transistor substrate in FIG. 1, and FIG. 1 is a cross-sectional view of the thin-film transistor substrate along a sectional line I-I' in FIG. 2. It should be noted that, for the sake of simplicity, FIG. 2 merely depicts a source electrode, a transparent electrode including a drain electrode and a pixel electrode, an active layer, and a second insulating layer.

Referring to FIGS. 1 and 2, the thin-film transistor substrate 100 of the present embodiment includes a substrate 110, a gate electrode 120, a gate insulating layer 130, an active layer 140, an etching stop layer 150, a source electrode 160, a first insulating layer 170, and a transparent electrode 180. The gate electrode 120 is located on the substrate 110. The gate insulating layer 130 is located on the substrate 110 and covers the gate electrode 120.

The active layer 140 is located on the gate insulating layer 130 and above the gate electrode 120. The active layer 140 includes, for example, a metal oxide semiconductor, such as an indium gallium zinc oxide (IGZO). The etching stop layer 150 is located on the active layer 140. The source electrode 160 is located on the etching stop layer 150 and passes through the etching stop layer 150 to contact the active layer 140 so as to electrically connect to the active layer 140. The source electrode 160 includes, for example, a metal, such as copper or aluminum.

The first insulating layer 170 is located on the etching stop layer 150 and covers the source electrode 160. In one embodiment, the thin-film transistor substrate 100 further includes a planar layer 210, a common electrode 220, and a second insulating layer 230, wherein the planar layer 210 is located on the first insulating layer 170. The common electrode 220 is disposed on the planar layer 210, and the second insulating layer 230 is disposed on the planar layer 210 and covers the common electrode 220.

The transparent electrode 180 includes a drain electrode 182 and a pixel electrode 184 connected thereto. The drain electrode 182 passes through the second insulating layer 230, the planar layer 210, the first insulating layer 170 and the etching stop layer 150 and directly contacts the active layer 140 to electrically connect to the active layer 140. The pixel electrode 184 is disposed on the second insulating layer 230 and overlaps the common electrode 220. The transparent electrode 180 includes a metal oxide, such as an indium tin oxide (ITO).

In one embodiment, the distance D1 between the portion of the source electrode 160 directly contacting the active layer 140 and the portion of the drain electrode 182 directly contacting the active layer 140 ranges from about 2 μm to about 10 μm. For example, the distance D1 ranges from about 3 μm to about 8 μm.

It should be noted that the source electrode and the drain electrode of the prior art are both metal layers and are formed in the same photolithography process (or the same photolithography etching process), and therefore the distance between the openings is limited by the resolution limit of the present photolithography technique. Thus, in the prior art, the distance usually is about 8.5 μm.

In one embodiment, the width L1 of the active layer 140 ranges from about 12 μm to about 35 μm. For example, the width L1 of the active layer 140 ranges from about 13 μm to about 24 μm. It should be noted that the prior art is limited by the resolution limit of the present photolithography technique, so the width in the prior art usually is about 24.5 μm.

One of the manufacturing methods of the thin-film transistor substrate 100 is described as follows.

Firstly, the gate electrode 120, the gate insulating layer 130 covering the gate electrode 120, and the active layer 140 on the gate insulating layer 130 are sequentially formed on the substrate 110. Then, the etching stop layer 150 is formed on the gate insulating layer 130 to cover the active layer 140, and then the etching stop layer 150 is patterned to form the opening 152 exposing the active layer 140.

Then, the source electrode 160 is formed on the etching stop layer 150 and contacts the active layer 140 via the opening 152 to electrically connect to the active layer 140. Then, the first insulating layer 170 is formed on the etching stop layer 150, wherein the first insulating layer 170 covers the source electrode 160. Then, the planar layer 210 is formed on the first insulating layer 170, and the common electrode 220 is formed on the planar layer 210. Then, the second insulating layer 230 is formed on the planar layer 210 to cover the common electrode 220.

Then, the through hole T passing through the second insulating layer 230, the planar layer 210, the first insulating layer 170, and the etching stop layer 150 is formed. Then, the transparent electrode 180 is formed on the second insulating layer 230, and the transparent electrode 180 extends into the through hole T to directly contact the active layer 140 so as to electrically connect to the active layer 140.

It should be noted that the present embodiment adopts only one process step to form the transparent electrode 180 with the functions of the drain electrode and the pixel electrode to replace the conventional method for forming the drain electrode and the pixel electrode, wherein the conventional method adopts different process steps to form the drain electrode and the pixel electrode. Thus, the present embodiment can simplify the process for forming the drain electrode and the pixel electrode and reduce the channel length.

Furthermore, in the present embodiment, the opening 152 for accommodating the source electrode 160 and the through hole T for accommodating the drain electrode 182 are formed in different photolithography processes (or different photolithography etching processes), and thus the distance D1 between the opening 152 and the through hole T is not limited by the resolution limit of the present photolithography technique and may be reduced significantly, which reduces the width L1 of the active layer 140.

The reduction of the distance D1 is equivalent to the reduction of the channel width, which can improve the charging performance of the thin-film transistor. The reduction of the width L1 of the active layer 140 is equivalent to the reduction of the whole size of the thin-film transistor, and thus the aperture ratio of the pixels is improved, or the thin-film transistor may be applied in display panels with a higher resolution.

Furthermore, the transparent electrode 180 of the present embodiment includes a metal oxide (such as an indium tin oxide), and the active layer 140 may include a metal oxide semiconductor (such as an Indium gallium zinc oxide), and thus an ohmic contact may be formed between the transparent electrode 180 and the active layer 140, which can effectively reduce the contact resistance between the transparent electrode 180 and the active layer 140.

Figure 3:
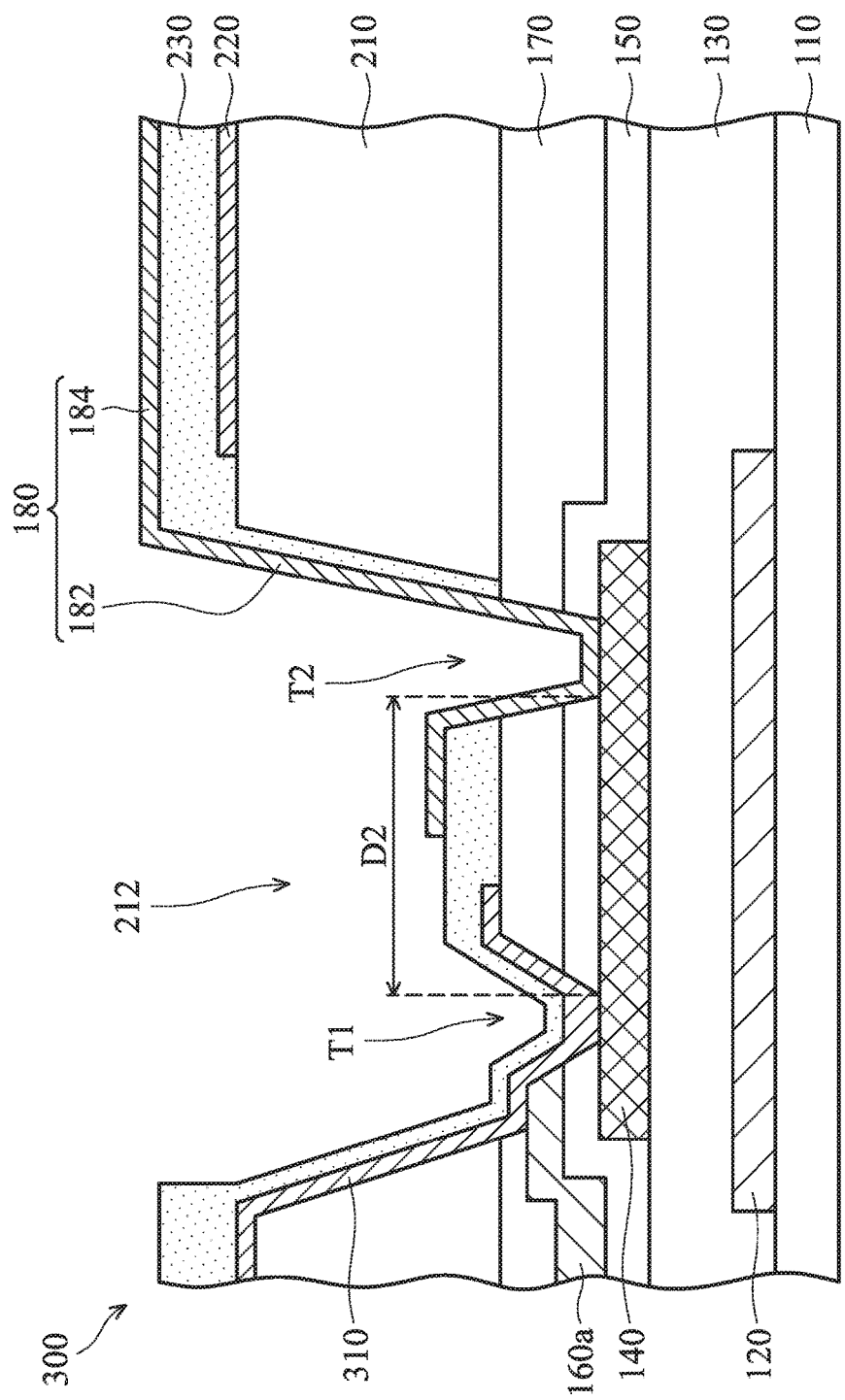
FIG. 3 is a cross-sectional view of a thin-film transistor substrate in accordance with an embodiment of the present invention.
Figure 4:
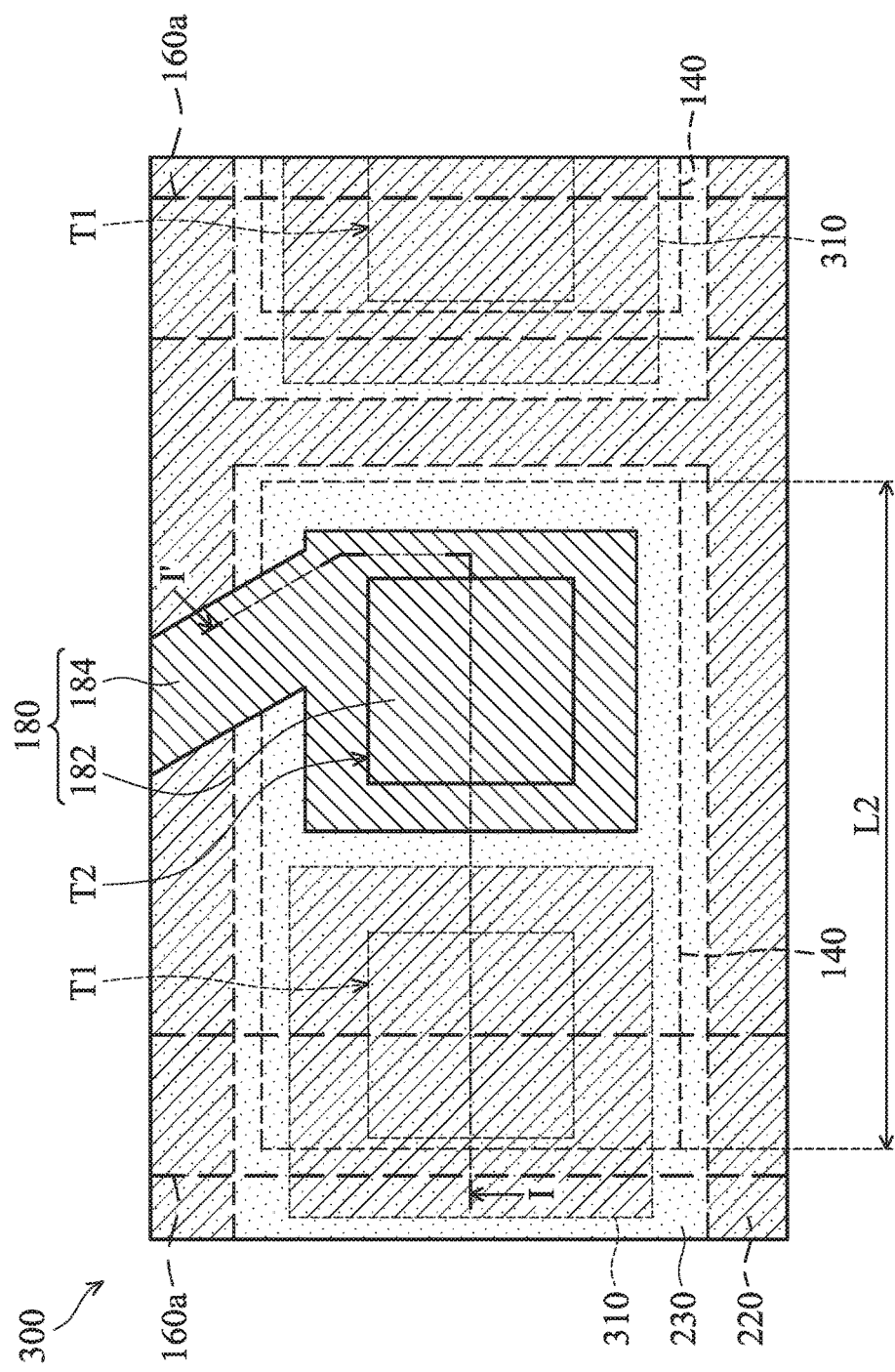
FIG. 4 is a top view of the thin-film transistor substrate in FIG. 3.

FIG. 3 is a cross-sectional view of a thin-film transistor substrate in accordance with an embodiment of the present invention. FIG. 4 is a top view of the thin-film transistor substrate in FIG. 3, and FIG. 3 is a cross-sectional view of the thin-film transistor substrate along a sectional line I-I' in FIG. 4. It should be noted that, for the sake of simplicity, FIG. 4 merely depicts a source electrode, a transparent electrode including a drain electrode and a pixel electrode, an active layer, a second insulating layer, a conductive layer, and a common electrode.

Referring to FIGS. 3 and 4, the thin-film transistor substrate 300 of the present embodiment is similar to the thin-film transistor substrate 100 of FIGS. 1 and 2, except that the source electrode 160a of the thin-film transistor substrate 300 of the present embodiment is disposed on the etching stop layer 150 and does not pass through the etching stop layer 150, and a conductive layer 310 is disposed on the first insulating layer 170 and passes through the first insulating layer 170 and the etching stop layer 150 to directly contact and electrically connect to the active layer 140 and the source electrode 160a. The conductive layer 310 includes, for example, a transparent metal oxide. In one embodiment, the source electrode 160a and the active layer 140 may be overlapped with each other.

In one embodiment, the thin-film transistor substrate 300 may further include a planar layer 210, a common electrode 220, and a second insulating layer 230, wherein the planar layer 210 is disposed on the first insulating layer 170, the common electrode 220 is disposed on the planar layer 210, the second insulating layer 230 is disposed on the planar layer 210 and covers the common electrode 220 and the conductive layer 310.

In this case, the conductive layer 310 is disposed on the planar layer 210 and passes through the planar layer 210, the first insulating layer 170, and the etching stop layer 150. In one embodiment, the common electrode 220 and the conductive layer 310 are formed in the same process step, so the common electrode 220 and the conductive layer 310 have the same material. The drain electrode 182 passes through the second insulating layer 230, the planar layer 210, the first insulating layer 170, and the etching stop layer 150, wherein the pixel electrode 184 is disposed on the second insulating layer 230 and overlaps the common electrode 220.

In one embodiment, the distance D2 between the portion of the conductive layer 310 directly contacting the active layer 140 and the portion of the drain electrode 182 directly contacting the active layer 140 ranges from about 1.5 μm to about 10 μm. For example, the distance D2 ranges from about 2.5 μm to about 8 μm. In one embodiment, the width L2 of the active layer 140 ranges from about 9.5 μm to about 30 μm. For example, the width L2 of the active layer 140 ranges from about 11 μm to about 24 μm.

One of the manufacturing methods of the thin-film transistor substrate 300 is described as follows.

Firstly, the gate electrode 120, the gate insulating layer 130 covering the gate electrode 120, and the active layer 140 on the gate insulating layer 130 are sequentially formed on the substrate 110. Then, the etching stop layer 150 is formed on the gate insulating layer 130 to cover the active layer 140.

Then, the source electrode 160a is formed on the etching stop layer 150. Then, the first insulating layer 170 is formed on the etching stop layer 150, wherein the first insulating layer 170 covers the source electrode 160a. Then, the planar layer 210 is formed on the first insulating layer 170. Then, the planar layer 210 is patterned to form an opening 212 in the planar layer 210, wherein the opening 212 exposes the portion of the first insulating layer 170 on the active layer 140.

Then, a through hole T1 passing through the first insulating layer 170 and the etching stop layer 150 is formed, wherein the through hole T1 exposes the source electrode 160a and the active layer 140. Then, a conductive layer (not shown) is formed on the planar layer 210 and the first insulating layer 170. Then, the conductive layer is patterned to form the common electrode 220 on the planar layer 210 and the conductive layer 310 on the first insulating layer 170, wherein the conductive layer 310 may extend into the through hole T1 to directly contact and electrically connect to the source electrode 160a and the active layer 140. In one embodiment, the conductive layer 310 may be further formed on the planar layer 210. The common electrode 220 and the conductive layer 310 are formed in the same process step, so the common electrode 220 and the conductive layer 310 have the same material.

Then, the second insulating layer 230 is formed on the planar layer 210 and the first insulating layer 170 exposed by the opening 212 to cover the common electrode 220 and the conductive layer 310. Then, the through hole T2 passing through the second insulating layer 230, the first insulating layer 170 and the etching stop layer 150 is formed. Then, the transparent electrode 180 is formed on the second insulating layer 230, wherein the transparent electrode 180 extends into the through hole T2 to directly contact and electrically connect to the active layer 140, and the transparent electrode 180 includes the drain electrode 182 and the pixel electrode 184. In other words, the drain electrode 182 and the pixel electrode 184 are formed in the same process step.

Figure 5:
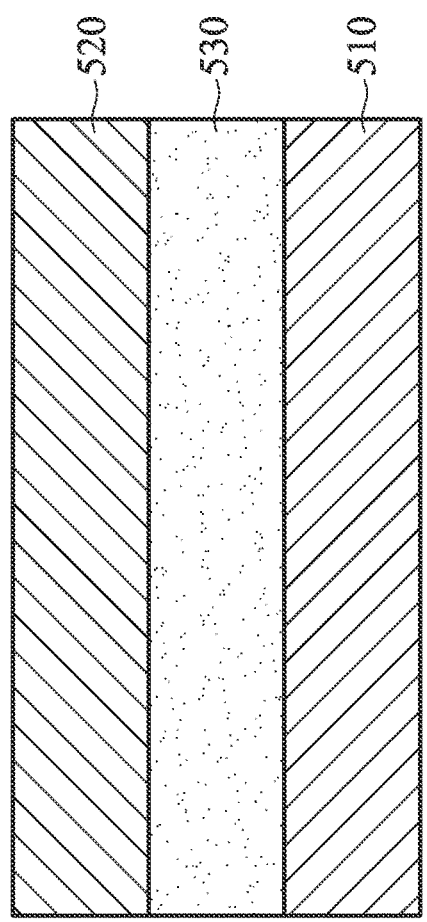
FIG. 5 is a cross-sectional view of a display in accordance with an embodiment of the present invention.

FIG. 5 is a cross-sectional view of a display in accordance with an embodiment of the present invention. Referring to FIG. 5, the display 500 of the present embodiment includes a thin-film transistor substrate 510, a counter substrate 520 and a display medium 530 sandwiched therebetween. The thin-film transistor substrate 510 may be the thin-film transistor substrate shown in FIG. 1, 2, 3 or 4. The display medium 530 may be a liquid crystal layer or an organic light-emitting layer. The counter substrate 520 is, for example, a color filter substrate or a transparent substrate.

In view of the foregoing, the present invention simplifies the process for forming the drain electrode and the pixel electrode and reduces the channel length by forming the transparent electrode with the functions of the drain electrode and the pixel electrode.

Furthermore, in the present invention, the opening for accommodating the source electrode and the through hole for accommodating the drain electrode are formed in different photolithography processes (or different photolithography etching processes), and thus the distance between the opening and the through hole is not limited by the resolution limit of the present photolithography technique and may be reduced significantly, which reduces the width of the active layer, improves the charging performance of the thin-film transistor and the aperture ratio of the pixels, or the thin-film transistor may be applied in display panels with a higher resolution.

Furthermore, the transparent electrode of the present embodiment includes a metal oxide, and the active layer may include a metal oxide semiconductor, and thus an ohmic contact may be formed between the transparent electrode and the active layer, which can effectively reduce the contact resistance between the transparent electrode and the active layer.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A thin-film transistor substrate, comprising:
  a substrate;
  a gate electrode disposed on the substrate;
  a gate insulating layer disposed on the substrate and covering the gate electrode;
  an active layer disposed on the gate insulating layer and above the gate electrode, wherein the active layer comprises a metal oxide;
  a source electrode disposed on and electrically connecting to the active layer;
  a first insulating layer covering the source electrode; and
  a drain electrode disposed on and electrically connecting to the active layer, wherein the drain electrode comprises a metal oxide layer, wherein a width of the active layer ranges from 12 μm to 35 μm, wherein a distance between a portion of the source electrode contacting the active layer and a portion of the drain electrode contacting the active layer ranges from 3 μm to 8 μm.

2. The thin-film transistor substrate as claimed in claim 1, wherein the width of the active layer ranges from 13 μm to 24 μm.

3. The thin-film transistor substrate as claimed in claim 1, wherein a thickness of the gate electrode is larger than a thickness of the metal oxide layer.

4. The thin-film transistor substrate as claimed in claim 1, further comprising a pixel electrode disposed on the first insulating layer, wherein the pixel electrode comprises a metal oxide.

5. The thin-film transistor substrate as claimed in claim 4, further comprising:
   a planar layer disposed on the first insulating layer;
   a common electrode disposed on the planar layer; and
   a second insulating layer disposed between the pixel electrode and the common electrode.

6. The thin-film transistor substrate as claimed in claim 1, further comprising:
   a conductive layer disposed on the first insulating layer and passing through the first insulating layer to contact the active layer and electrically connect to the active layer and the source electrode.

7. The thin-film transistor substrate as claimed in claim 6, further comprising:
   a planar layer disposed on the first insulating layer, wherein the conductive layer is disposed on the planar layer and passes through the planar layer and the first insulating layer.

8. The thin-film transistor substrate as claimed in claim 7, further comprising:
   a common electrode disposed on the planar layer, wherein the common electrode and the conductive layer are formed in the same process step.

9. The thin-film transistor substrate as claimed in claim 6, wherein a distance between the portion of the conductive layer directly contacting the active layer and the portion of the drain electrode directly contacting the active layer ranges from 1.5 μm to 10 μm.

10. A thin-film transistor substrate, comprising:
    a substrate;
    a gate electrode disposed on the substrate;
    a gate insulating layer disposed on the substrate and covering the gate electrode;
    an active layer disposed on the gate insulating layer and above the gate electrode, wherein the active layer comprises a metal oxide;
    a source electrode disposed on and electrically connecting to the active layer;
    a first insulating layer covering the source electrode; and
    a drain electrode disposed on and electrically connecting to the active layer,
    wherein a width of the active layer ranges from 12 μm to 35 μm,
    wherein a distance between a portion of the source electrode contacting the active layer and a portion of the drain electrode contacting the active layer ranges from 3 μm to 8 μm.

11. The thin-film transistor substrate as claimed in claim 10, wherein the width of the active layer ranges from 13 μm to 24 μm.

12. The thin-film transistor substrate as claimed in claim 10, further comprising a pixel electrode disposed on the first insulating layer, wherein the pixel electrode comprises a metal oxide.

13. The thin-film transistor substrate as claimed in claim 12, further comprising:
    a planar layer disposed on the first insulating layer;
    a common electrode disposed on the planar layer; and
    a second insulating layer disposed between the common electrode and the pixel electrode.

14. The thin-film transistor substrate as claimed in claim 10, further comprising:
    a conductive layer disposed on the first insulating layer and passing through the first insulating layer to contact the active layer and electrically connect to the active layer and the source electrode.

15. The thin-film transistor substrate as claimed in claim 14, further comprising:
    a planar layer disposed on the first insulating layer, wherein the conductive layer is disposed on the planar layer and passes through the planar layer and the first insulating layer.

16. The thin-film transistor substrate as claimed in claim 15, further comprising:
    a common electrode disposed on the planar layer, wherein the common electrode and the conductive layer are formed in the same process step.

17. The thin-film transistor substrate as claimed in claim 14, wherein a distance between the portion of the conductive layer directly contacting the active layer and the portion of the drain electrode directly contacting the active layer ranges from 1.5 μm to 10 μm.

* * * * *